United States Patent [19]
Takayanagi

[11] Patent Number: 5,976,762
[45] Date of Patent: Nov. 2, 1999

[54] PHOTOSENSITIVE ELEMENT AND PROCESS FOR PRODUCING MULTILAYER PRINTED WIRING BOARD

[75] Inventor: Takashi Takayanagi, Shizuoka, Japan

[73] Assignee: Fuji Photo Film Co., Ltd., Kanagawa, Japan

[21] Appl. No.: 08/807,776

[22] Filed: Feb. 28, 1997

[30] Foreign Application Priority Data

Mar. 6, 1996 [JP] Japan ................................. 8-048792

[51] Int. Cl.$^6$ ....................................................... G03F 7/11
[52] U.S. Cl. ...................... 430/271.1; 430/954; 430/260; 430/262; 430/263; 430/273.1
[58] Field of Search ............................. 430/271.1, 273.1, 430/954, 260, 262, 263

[56] References Cited

U.S. PATENT DOCUMENTS

| | | | |
|---|---|---|---|
| 4,216,246 | 8/1980 | Iwasaki et al. | 427/43.1 |
| 4,559,292 | 12/1985 | Geissler et al. | 430/256 |
| 5,288,589 | 2/1994 | McKeever et al. | 430/262 |
| 5,792,595 | 8/1998 | Takayanagi et al. | 430/271.1 |

FOREIGN PATENT DOCUMENTS 63-126297  5/1988  Japan.
4-148590   5/1992  Japan.

*Primary Examiner*—Cynthia Hamilton
*Attorney, Agent, or Firm*—Sughrue, Mion, Zinn, Macpeak & Seas, PLLC

[57] ABSTRACT

A photosensitive element comprising a temporary support having thereon an aqueous resin layer which contains at least one kind of fine particles having an average particle size or agglomerated particle size of 1 to 10 $\mu$m. The fine particles impart a roughened surface to the aqueous resin layer. Furthermore, a photosensitive insulating resin layer is provided on the aqueous resin layer. Also disclosed is an insulating resin image having a roughened surface which is prepared by a process comprising the steps of providing the above-described photosensitive element, laminating the photosensitive element on an insulating substrate, and pattern exposing and developing the photosensitive insulating resin layer. Also disclosed is a process for producing an multilayer printed wiring board comprising the steps of laminating the above-described photosensitive element on an insulating substrate having thereon a first wiring pattern, forming via holes in the photosensitive insulating resin layer, depositing a conductive material on the photosensitive insulating resin layer and in the via holes, and forming a second wiring pattern on the insulating resin layer which is interconnected to the first wiring pattern through the via holes.

7 Claims, 2 Drawing Sheets

PHOTOSENSITIVE ELEMENT AND PROCESS FOR PRODUCING MULTILAYER PRINTED WIRING BOARD

FIELD OF THE INVENTION

This invention relates to a photosensitive element for use in the manufacture of printed wiring boards (hereinafter abbreviated as PWB), and which is particularly useful as an interlayer dielectric for the production of multilayer printed wiring boards (hereinafter abbreviated as ML-PWB) by a build-up system. The present invention also relates to a process for producing ML-PWB using the photosensitive element.

BACKGROUND OF THE INVENTION

With the recent rapid advancement of electronic equipment in terms of function, weight and size reduction, there has been a demand for high-density mounting of electronic components. To achieve these objectives, it is important to increase the density of PWB. A so-called build-up system has been proposed as one approach for increasing the PWB density. The build-up system is characterized in that interlayer connection is achieved by forming fine via holes through a photosensitive interlayer dielectric instead of drilling conventional through-holes.

A specific example of a build-up system which makes use of a photosensitive interlayer dielectric is disclosed in JP-A-4-148590 (the term "JP-A" as used herein means an "unexamined published Japanese patent application"). In this method, a photosensitive insulating resin layer is provided on a first circuit pattern. After forming via holes by photolithography, the resin layer is subjected to chemical surface roughening. The chemical surface roughening enhances adhesion of the resin layer to an electroless copper deposit and also to an electro copper deposit overlaid thereon. The chemical treatment provides the resin surface with fine unevenness to thereby achieve improved adhesion through an anchoring effect.

However, the adhesion achieved by providing surface unevenness (surface roughening treatment) in JP-A-4-148590 is still insufficient, leaving room for further improvement. Moreover, chromic acid, etc. which is used in the chemical surface roughening, is unfavorable in consideration of safety and environmental conservation.

JP-A-63-126297 discloses a method comprising hardening a photosensitive insulating resin having dispersed therein fine particles soluble in an acid or an oxidizing agent and dissolving the dispersed particles with a strong acid or a strong oxidizing agent, such as chromium (VI) oxide. This forms unevenness on the resin surface, to thereby improve adhesion to a metal deposit.

However, the treating agents used in the technique of JP-A-63-126297 are also problematical for safety and environmental consideration. In addition, when the photosensitive resin layer is provided on an insulating substrate by a laminating method (heat bonding or press bonding), which is simpler than a printing or coating technique and is relatively free from defects, defects such as bubble entrapment on the surface of the insulating substrate tend to occur because of the fine particles contained in the photosensitive insulating resin. Thus, this technique does not provide a practically useful product.

SUMMARY OF THE INVENTION

An object of the present invention is to provide a photosensitive element which makes it possible to provide a photosensitive insulating resin layer via a laminating system, and to improve adhesion to a metallic deposit without causing safety and environmental problems.

Another object of the invention is to provide a process for producing a ML-PWB using the photosensitive element.

The above objects are accomplished by a photosensitive element comprising:

a temporary support having provided thereon an aqueous resin layer which contains at least one kind of fine particles having an average particle size or an average agglomerated particle size of from 1 to 10 $\mu$m, said fine particles imparting a roughened surface to said aqueous resin layer; and a photosensitive insulating resin layer provided on said aqueous resin layer.

The above objects are also accomplished by a process for producing a ML-PWB comprising the steps of:

laminating the above-described photosensitive element on an insulating substrate having thereon a first wiring pattern;

forming via holes by pattern in said photosensitive insulating resin layer;

depositing a conductive material on said photosensitive insulating resin layer and in said via holes; and forming a second wiring pattern on said insulating resin layer which is interconnected to the first wiring pattern through said via holes.

Because the aqueous resin layer provided on the temporary support has an uneven or roughened surface due to the fine particles, the surface of the photosensitive insulating resin layer in contact with the aqueous resin layer also has an uneven surface. When the photosensitive insulating resin layer which is transferred onto an insulating substrate by laminating is imagewise exposed and developed to form via holes, the aqueous resin layer at the top surface of the laminate is removed by dissolving or peeling. At the same time, the fine particles at the surface of the photosensitive insulating resin layer fall off or dissolve. As a result, the photosensitive insulating resin layer after development has an uneven surface, to thereby provide satisfactory adhesion to a metallic deposit formed thereon. In order to impart moderate surface unevenness to the surface of the photosensitive insulating resin layer, the photosensitive insulating resin layer is preferably formed on the aqueous resin layer by coating.

According to the present invention, the photosensitive insulating resin layer is readily provided with an uneven surface by laminating the photosensitive element of the invention on an insulating substrate having a wiring pattern, and then exposing and developing. There is no need to mechanically sand the resin surface by honing, etc. or chemically grain the resin surface by using a processing solution that is undesirable in view of safety and the environment, such as chromic acid. Therefore, the production steps for manufacturing a ML-PWB by a build-up system can be greatly simplified.

DETAILED DESCRIPTION OF THE INVENTION

Figure 1:
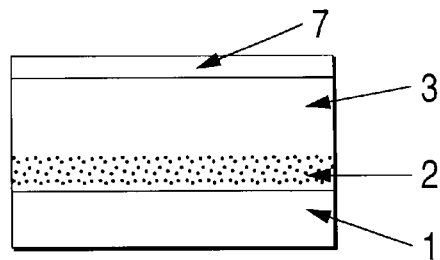
FIGS. 1(a), 1(b) and 1(c) schematically illustrate one example of the photosensitive element of the present invention, and the process of forming via holes on a first wiring pattern using the photosensitive element.
Figure 1:
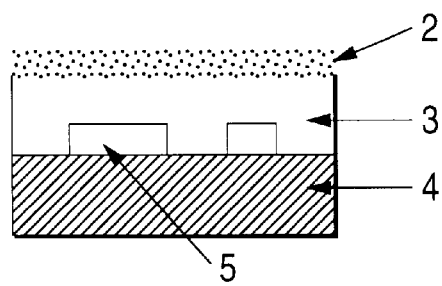
Figure 1:
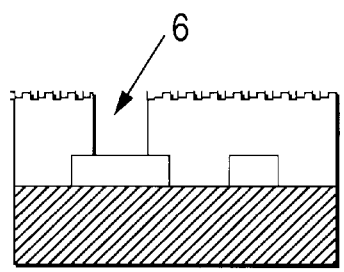

The temporary support for use in the photosensitive element of the present invention can be a plastic film, such as a polyethylene terephthalate film. A suitable film thickness is 10 to 70 μm. If the film thickness is less than 10 μm, the film is difficult to handle and tends to undergo wrinkling. If the thickness exceeds 70 μm, pattern exposure, if conducted through the temporary support, is hindered by light scattering by the temporary support which tends to considerably reduce the resolving power. The desirable thickness of the temporary support is preferably less than 30 μm from the viewpoint of flexibility so that it conforms with the surface profile of the substrate when the photosensitive element is laminated thereon.

The resin for use as an aqueous resin layer that is provided on the temporary support is selected from water-soluble or water-swellable resins. Such resins preferably include polyvinyl alcohol and its derivatives, polyvinylpyrrolidone and its derivatives, cellulose and its derivatives, gelatin and its derivatives and polyacrylic acid and its derivatives. These aqueous resins may be used either individually or as a combination thereof.

The fine particles that are added to the aqueous resin are not particularly limited in kind as long as their average particle size or agglomerated particle size falls within a range of from 1 to 10 μm. The fine particles include organic or inorganic low-molecular weight particles and organic polymer particles. Suitable examples thereof include silica, calcium silicate, calcium carbonate, zinc oxide, titanium oxide, zirconia, murite, calcium hydroxide, talc, aluminum hydroxide, diatomaceous earth, and barium sulfate. These particles may be used either individually or as a combination of two or more thereof.

The fine particles are suitably used in a weight ratio of about 0.5 to 5 to the aqueous resin of the aqueous resin layer. From the standpoint of stability of the solution of the aqueous resin having dispersed therein the fine particles, a preferred weight ratio of the particles is not more than 4. If the weight ratio is less than 0.5, the surface unevenness of the aqueous resin layer is insufficient. This results in insufficient surface unevenness of the photosensitive insulating resin layer, i.e., insufficient adhesion to a metallic deposit.

Preparation of the aqueous resin solution containing the fine particles is not particularly limited. For example, it may be prepared by mixing the fine particles with a solution of the aqueous resin in water or in a mixed solvent of water and a water-miscible organic solvent, such as methanol, by stirring. If the particles are agglomerated to a large size, the mixture can be strongly stirred in a homogenizer, etc. or dispersed in a paint shaker, etc. The aqueous resin solution containing the fine particles can also be prepared by mixing a previously prepared dispersion of the fine particles with the aqueous resin. If desired, the aqueous resin solution may contain a surface active agent or a solvent, e.g., methanol, as a mixture with water to improve spreadability on the temporary support. A dispersant may be added to prevent particle sedimentation.

The aqueous resin solution containing the fine particles is applied to a temporary support, such as a plastic film, for example, by bar coating, preferably to a dry thickness of about 2 to 15 μm as measured with a film thickness gauge. If the thickness is less than 2 μm, the height of the unevenness of the surface of the photosensitive insulating resin layer is insufficient for satisfactory adhesion to a metallic deposit. If the thickness is greater than 15 μm, the developing time required for removing the aqueous resin layer, either by dissolving or stripping, becomes longer. A preferred thickness of the aqueous resin layer is 10 μm or less.

The roughened surface of the aqueous resin layer imparts the roughness to the surface of the photosensitive insulating resin layer provided thereon so that the photosensitive insulating resin layer may have improved adhesion to a metallic deposit formed thereon. If the photosensitive insulating resin layer has an even or smooth surface, a metallic deposit formed thereon readily peel off, thus making it difficult to produce a circuit board by a build-up system.

The surface roughness in the present invention is evaluated in terms of peel strength of a metal deposit in accordance with the cross-cut adhesion test specified in JIS K5400 (5 mm×5 mm squares). In the above specified adhesion test, the metal deposit formed on the photosensitive insulating resin layer should score at least 8 points.

In the present invention, the photosensitive element is laminated on an insulating substrate previously having thereon a wiring pattern. Therefore, the photosensitive insulating resin layer must not be hardened with time to such a degree that it interferes with laminating property. As long as this condition is met, the kind of photosensitive insulating resin for use in the present invention is not particularly limited, further provided that the performance requirements for production of ML-PWB by a build-up system are satisfied with respect to insulation, pattern formation, adhesion, strength and processing suitability (e.g., resistance to electroless plating and resistance to electroplating).

Preferred examples of the photosensitive insulating resin include those disclosed in EP 0339306 B1, U.S. Pat No. 4,987,054, JP-A-7-110577 and JP-A-7-209866, which comprise a photopolymerization initiator(s), an addition polymerizable monomer(s) having an ethylenically unsaturated double bond, and an amine-modified styrene/maleic anhydride copolymer resin (the modifier amine includes benzylamine, cyclohexlyamine, etc.). The photosensitive insulating resin layer is preferably has a thickness of from 20 to 120 μm.

When the photosensitive insulating resin layer is formed by coating, the solution of the resin may contain a surface active agent, a matting agent (fine particles), and the like to improve spreadability. The solvent for the resin solution is not particularly limited. Examples of useful solvents are methyl ethyl ketone and cyclohexanone. After the photosensitive insulating resin layer dries, a polypropylene film, etc. can be laminated on the photosensitive insulating resin layer for protection.

A typical example of the photosensitive element of the present invention is shown in FIG. 1(a), which includes temporary film support 1, aqueous resin layer 2 containing fine particles, photosensitive insulating resin layer 3, and protective film 7 for the photosensitive insulating resin layer.

The ML-PWB according to the invention can be produced as follows. The above-described photosensitive element is laminated on an insulating substrate having thereon a wiring pattern under heat and pressure, usually by means of a laminator. If the photosensitive element has a protective film, the protective film is stripped off, and the uncovered photosensitive insulating resin layer is brought into contact with the substrate.

The substrate having a wiring pattern thereon can be made of various materials, such as insulating materials and metallic materials. The insulating substrate is not particularly limited and includes an organic substrate, an inorganic substrate, and a composite thereof. Epoxy/glass laminates and ceramic substrates are preferred. A schematic cross section of the photosensitive element laminated on the substrate is shown in FIG. 1(b) including an insulating substrate 4 and a previously formed wiring pattern 5 thereon. In FIG. 1(b), temporary support film 1 has been stripped off.

When carrying out a subsequent exposure, the temporary support film may remain on the laminate or may be stripped off. When a high resolving power is required, the temporary support is preferably removed before exposure. Exposure can be carried out with a ultrahigh-pressure mercury lamp, etc. Either diffused light or parallel rays of light can be used for the exposure.

The exposed photosensitive insulating resin layer is then developed with a developer to make via holes. Useful developers include a solvent, such as a chlorine-containing solvent (e.g., chlorocene), and an aqueous alkali solution, such as an aqueous solution containing about 0.3 to 2% by weight of a developing agent, e.g., sodium carbonate, sodium hydroxide, potassium hydroxide or tetramethylammonium hydroxide. The aqueous alkali solution may contain, as needed, a surface active agent or a solvent such as benzyl alcohol. Development can be carried out, for example, by shower development, brush development or a combination thereof.

FIG. 1(c) shows the laminate after development processing including via hole 6 for interlayer connection. The top surface of the developed photosensitive insulating resin layer (interlayer dielectric) is uneven, such that it provides an anchoring effect in adhering to metallic wiring formed by electroless plating and electroplating.

After completing the development, the element is preferably subjected to post-exposure by means of the same aligner as used above at an exposure intensity of 200 to 5000 mj/cm$^2$ and then to post-baking at 120 to 200° C. This treatment sufficiently hardens the remaining insulating resin to further improve heat resistance and resistance against a strong alkali used in electroless plating.

When the development processing is insufficient for completely removing the aqueous resin layer, the element may be immersed in a treating solution, such as an acid (e.g., hydrochloric acid) or a sodium hydroxide aqueous solution, so as to remove the residual aqueous resin layer and also to clean the surface of the photosensitive insulating resin layer for improving plate adhesion.

The element is then electroless plated with copper, nickel, etc. Electroless plating is preceded by pretreating the resin surface. Such pretreatments may include degreasing, catalyst adsorption and catalyst activation. The pretreatment is not particularly limited, and commercially available processing solutions can be used appropriately. Also, a degreasing process is not always needed. The electroless plating is conducted to a deposit thickness that allows for subsequent electroplating, usually about 0.2 to 0.5 μm.

Figure 2:
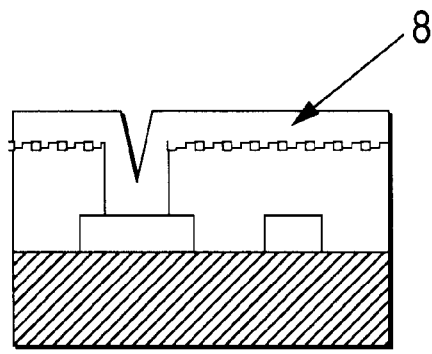
FIGS. 2(a) and 2(b) schematically illustrate the subsequent steps of electroless copper plating, electro copper plating, and forming a second wiring pattern which is interconnected to the first wiring pattern through the via holes.
Figure 2:
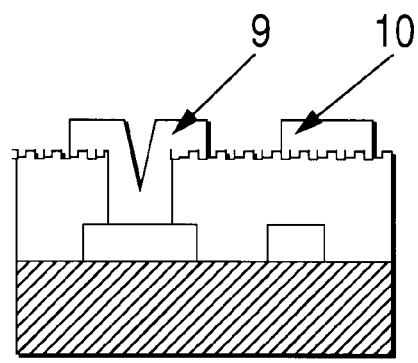

The electroless-plated surface is then subjected to electroplating for making a wiring pattern. Electro copper plating is usually suitable for wiring. While not limiting, an electro copper plating bath can be a copper sulfate bath or a copper pyrophosphate bath. FIG. 2(a) shows the element having formed thereon an electroless deposit and an electrodeposit 8, inclusively.

The electro-deposit is formed into a wiring pattern by a general subtractive system. Subtractive wiring formation can be carried out by laminating a commercially available photoresist film (Dry Film Resist, e.g., A840 available from Fuji Photo Film Co., Ltd.) or applying a liquid photoresist. As a result, a second wiring layer is formed and, at the same time, the first wiring layer and the second wiring layer are interconnected by the copper deposit in the via holes. FIG. 2(b) shows a wiring board having a second wiring layer, including interlayer connection 9 at the via hole and the second wiring 10.

An ML-PWB is obtained by repeating the above-described steps.

The invention will now be illustrated in greater detail with reference to the following Examples, but it should be understood that the invention is not to be construed as being limited thereto. Unless otherwise specified, all parts are given by weight.

EXAMPLE 1

1. Preparation of Photosensitive Element

An aqueous resin composition having the following formulation was dispersed in a paint shaker for 60 minutes, applied to a 20 μm thick polyester film to a coating thickness of 3 μm, and dried at 100° C. for 10 minutes to form an aqueous resin layer.

| Formulation of Aqueous Resin Composition: | |
|---|---|
| Polyvinyl alcohol PVA205 (produced by Kurary Co., Ltd.) | 1.25 parts |
| Polyvinylpyrrolidone K90 (produced by Shin-Etsu Chemical Co., Ltd.) | 0.629 part |
| Hydroxypropylmethyl cellulose TC5E (produced by Gokyo Sangyo K.K.) | 1.25 parts |
| Zinc oxide ZnO-100 (produced by Sumitomo Osaka Cement Co., Ltd.) | 6.62 parts |
| Fluorine-containing surface active agent Surflon S131 (produced by Asahi Glass Co., Ltd.) | 0.419 part |
| Pure water | 43.35 parts |
| Methanol | 53.1 parts |

A photosensitive insulating resin composition having the folowing formulation was applied to the aqueous resin layer to a dry thickness of 42 μm and dried at 100° C. for 15 minutes to obtain a photosensitive element. The synthesis of the benzylamine-modified styrene/maleic acid copolymer used as a binder is described below.

| Formulation of Photosensitive Insulating Resin Composition: | |
|---|---|
| Benzylamine-modified styrene/maleic acid copolymer (binder) | 21.5 parts |
| Photopolymerization initiator 9-Phenylacridine (produced by Nihon Siber Hegner K.K.) | 1 part |
| Polyfunctional monomer M320 (produced by Toa Gosei Chemical Industry Co., Ltd.) | 10.8 parts |
| Polyfunctional monomer BPE500 (produced by Shin-nakamura Kagaku K.K.) | 10.8 parts |
| Fluorine-containing surface active agent F176PF (produced by Dainippon Ink and Chemicals, Inc.) | 0.34 part |
| Methyl ethyl ketone | 28.5 parts |
| Cyclohexanone | 22.59 parts |

Synthesis of Binder

In 612.8 parts of a propylene glycol monomethyl ether acetate/methyl ethyl ketone mixed solvent (80/20 by weight) was dissolved 153.2 parts of a styrene/maleic anhydride (68/32 by mole) copolymer (weight average molecular weight: about 12000). A solution of 26.8 parts of benzylamine in 107.2 parts of a propylene glycol monomethyl ether acetate/methyl ethyl ketone (80/20 by weight) mixed solvent was added dropwise to the polymer solution at room temperature over a period of about 1 hour. The mixture was stirred at room temperature for 6 hours while removing the solvent to obtain a benzylamine-modified styrene/maleic anhydride copolymer as a binder.

2. Preparation of ML-PWB

A wiring pattern comprised of wires having a height of 18 μm and a width of 100 μm at intervals of 200 μm was formed on an epoxy/glass laminate. The above-prepared photosensitive element was laminated thereon to provide a photosensitive insulating resin layer. The photosensitive insulating resin layer was exposed to diffused light at an exposure intensity of 100 mj/cm$^2$ through a pattern mask for interlayer connection, and then shower-developed with a 0.5 wt % aqueous solution of sodium carbonate at 40° C. for 30 seconds to thereby form via holes, remove the aqueous resin layer, and leave the top surface of the photosensitive insulating resin layer with a roughened surface (see FIG. 1(c)). The developed photosensitive insulating resin layer was subjected to post-exposure over its entire surface by means of a diffused light aligner at an exposure intensity of 1900 mj/cm$^2$ and then heat treated (post-baking) at 160° C. for 60 minutes.

The resulting element was further treated through the step of electroless copper plating according to the following procedures (a) to (e). All the processing solutions that were used in this sequence of operations are available from Meltex Inc.

a) Immersion in a pretreating solution (PC236) at 25° C. for 3 minutes, followed by washing with pure water for 2 minutes.

b) Immersion in a catalyst-imparting agent (Activator 444) at 25° C. for 6 minutes, followed by washing with pure water for 2 minutes.

c) Immersion in an activating solution (PA491) at 25° C. for 10 minutes, followed by washing with pure water for 2 minutes.

d) Immersion in an electroless copper plating bath (CU390) at 25° C. and pH 12.9 for 10 minutes, followed by washing with pure water for 5 minutes.

e) Drying at 100° C. for 15 minutes.

Thus, an electroless copper deposit having a thickness of about 0.3 μm was formed.

Subsequently, the electroless-plated element was immersed in a degreasing agent PC455, produced by Meltex Inc., at 25° C. for 30 seconds. After washing with water for 2 minutes, electro copper plating was conducted using a plating bath comprising 75 g/liter of copper sulfate, 190 g/liter of sulfuric acid, about 50 ppm of chloride ions, and 5 ml/liter of Copper Gream PCM produced by Meltex Inc. at a temperature of 25° C., a current density of 2.5 A/100 cm$^2$ and a plating time of 40 minutes. As a result, copper was deposited to a thickness of about 20 μm (see FIG. 2(a)). After baking the plated element in an oven at 1600° C. for 60 minutes, the copper deposit layer was etched through a dry film resist pattern to form copper wiring and interlayer connections (see FIG. 2(b)). When the resulting wiring board was subjected to a solder reflow heat resistance test at 260° C. for 20 seconds, no peeling or swelling of the wires, etc. was observed. Furthermore, the copper deposit scored 10 points on the cross-cut adhesion test specified in JIS K5400 (5 mm×5 mm squares), thus demonstrating satisfactory plate adhesion.

Another photosensitive element prepared as described above was further laminated on the resulting wiring board and processed in the same manner as described above to form a third wiring layer. The resulting ML-PWB did not exhibit any problem in the solder reflow heat resistance test. In the cross-cut adhesion test, the metal deposit scored 10 points which demonstrates satisfactory adhesion.

EXAMPLE 2

A wiring board having a second wiring layer was prepared in the same manner as in Example 1, except that the post-baking was followed by an immersion treatment in a 20 vol % aqueous solution of hydrochloric acid at 40° C. for 10 minutes. The resulting wiring board did not exhibit any problem in the solder reflow heat resistance test.

COMPARATIVE EXAMPLE 1

The same steps as in Example 1 were followed, except that the photosensitive element was prepared by using an aqueous resin composition having the same composition as in Example 1 but not containing zinc oxide particles. After the development processing, the surface of the photosensitive insulating resin layer was substantially even (i.e., smooth). During the electroless copper plating, the surface of the resin layer was swelled. After the washing and drying, the copper deposit peeled off to the extent that further processing could not be completed.

While the invention has been described in detail and with reference to specific examples thereof, it will be apparent to one skilled in the art that various changes and modifications can be made therein without departing from the spirit and scope thereof.

What is claimed is:

1. A photosensitive element comprising a temporary support having thereon:

a resin layer (1) comprising a water-soluble or water-swellable resin and containing at least one kind of fine particles having an average particle size or agglomerated particle size of from 1 to 10 μm, said fine particles imparting a roughened surface to said resin layer comprising a water-soluble or water-swellable resin; and a photosensitive insulating resin layer (2) provided on said resin layer (1) so that the two layers are in contact with each other.

2. The photosensitive element of claim 1, wherein the photosensitive insulating resin layer (2) is directly coated on said resin layer (1).

3. The photosensitive element of claim 1, wherein the water-soluble or water-swellable resin is selected from the group consisting of polyvinyl alcohol, polyvinylpyrrolidone, cellulose, gelatin, and polyacrylic acid.

4. The photosensitive element of claim 1, wherein said fine particles are selected from the group consisting of silica, calcium silicate, calcium carbonate, zinc oxide, titanium oxide, zirconia, murite, calcium hydroxide, talc, aluminum hydroxide, diatomaceous earth and barium sulfate.

5. The photosensitive element of claim 1, wherein the weight ratio of the fine particles to the water-soluble or water-swellable resin in the resin layer (1) comprising a water-soluble or water-swellable resin is from about 0.5 to about 5.

6. The photosensitive element of claim 1, wherein the resin layer (1) comprising a water-soluble or water-swellable resin is coated in a dry thickness of about 2 to about 15 μm.

7. The photosensitive element of claim 1, wherein the photosensitive insulating resin of the photosensitive insulating resin layer (2) comprises a photopolymerization initiator, an addition polymerizable monomer having an ethylenically unsaturated double bond and an amine-modified styrene/maleic anhydride copolymer resin.

* * * * *